United States Patent
Morgan et al.

(10) Patent No.: US 9,603,277 B2
(45) Date of Patent: Mar. 21, 2017

(54) FIELD-RECONFIGURABLE BACKPLANE SYSTEM

(71) Applicant: Adtran, Inc., Huntsville, AL (US)

(72) Inventors: Joshua Morgan, Madison, AL (US); Jared D. Cress, Decatur, AL (US)

(73) Assignee: Adtran, Inc., Huntsville, AL (US)

( * ) Notice: Subject to any disclaimer, the term of this patent is extended or adjusted under 35 U.S.C. 154(b) by 56 days.

(21) Appl. No.: 14/638,642

(22) Filed: Mar. 4, 2015

(65) Prior Publication Data

US 2015/0257301 A1    Sep. 10, 2015

Related U.S. Application Data

(60) Provisional application No. 61/948,843, filed on Mar. 6, 2014.

(51) Int. Cl.
*H05K 7/14*    (2006.01)

(52) U.S. Cl.
CPC .................................. *H05K 7/1425* (2013.01)

(58) Field of Classification Search
CPC .................................................... H05K 7/1425
See application file for complete search history.

(56) References Cited

U.S. PATENT DOCUMENTS

| | | | | |
|---|---|---|---|---|
| 3,807,572 A * | 4/1974 | Luvara | ................. | A47B 47/042 108/110 |
| 4,728,158 A * | 3/1988 | D'Elia et al. | .......... | A47B 57/06 211/184 |
| 5,746,326 A * | 5/1998 | Hong | ................... | H05K 9/0016 211/41.17 |
| 5,791,042 A * | 8/1998 | Baum | .................. | H05K 7/1425 29/760 |
| 6,007,169 A * | 12/1999 | Li | ....................... | H05K 7/20181 312/223.2 |
| 6,434,018 B1 * | 8/2002 | Waltz | ...................... | G06F 1/184 211/41.17 |
| 6,480,391 B1 * | 11/2002 | Monson | ............... | H05K 7/1425 312/223.1 |
| 6,665,189 B1 * | 12/2003 | Lebo | .................. | H05K 7/20545 211/41.17 |
| 7,106,577 B2 * | 9/2006 | Shih | ........................ | G06F 1/184 248/535 |
| 7,342,807 B2 * | 3/2008 | Mueller | ............... | H05K 7/1424 174/521 |
| 8,508,928 B2 * | 8/2013 | Killen | .................. | G11B 33/124 361/679.33 |
| 8,913,391 B2 * | 12/2014 | Ling | .................. | H05K 7/20545 165/185 |
| 8,982,565 B2 * | 3/2015 | Sherrod | ............... | H05K 7/1488 248/155.5 |
| 9,232,677 B2 * | 1/2016 | Rauline | ................ | H05K 7/1489 |
| 2002/0036894 A1 * | 3/2002 | Robbins | .................. | G06F 1/183 361/727 |

(Continued)

*Primary Examiner* — David M Sinclair
*Assistant Examiner* — Robert Brown
(74) *Attorney, Agent, or Firm* — Smith Tempel Blaha LLC; Michael J. Tempel

(57) ABSTRACT

In a circuit card chassis, a backplane system includes card guides that are slideable on rails to provide any selected spacing between adjacent circuit cards. A backplane connector assembly extends between each pair of slideable top and bottom card guides. Signal cables can be configured to connect any two backplane connector assemblies to each other.

8 Claims, 4 Drawing Sheets

(56) References Cited

U.S. PATENT DOCUMENTS

| | | | | |
|---|---|---|---|---|
| 2002/0131257 A1* | 9/2002 | Agard | H05K 7/1425 | 361/796 |
| 2002/0181194 A1* | 12/2002 | Ho | G06F 13/409 | 361/756 |
| 2003/0116515 A1* | 6/2003 | Ureshino | H05K 7/1425 | 211/41.17 |
| 2005/0078449 A1* | 4/2005 | Makooi | H04Q 1/035 | 361/695 |
| 2005/0094359 A1* | 5/2005 | Lee | G02B 6/4452 | 361/679.4 |
| 2005/0122701 A1* | 6/2005 | Coffey | H04Q 1/14 | 361/796 |
| 2006/0056137 A1* | 3/2006 | Mueller | H05K 7/1424 | 361/600 |
| 2006/0164814 A1* | 7/2006 | Titus | G06F 1/184 | 361/724 |
| 2006/0198098 A1* | 9/2006 | Clark | H05K 7/1425 | 361/679.01 |
| 2007/0119792 A1* | 5/2007 | Hendrix | H05K 7/1418 | 211/26 |
| 2008/0266813 A1* | 10/2008 | Carlisi | G06F 1/183 | 361/727 |
| 2011/0149524 A1* | 6/2011 | Westphall | H05K 7/1425 | 361/725 |
| 2012/0069514 A1* | 3/2012 | Ross | H05K 7/20727 | 361/679.33 |
| 2012/0286634 A1* | 11/2012 | Tanaka | G06F 1/184 | 312/223.2 |
| 2013/0284682 A1* | 10/2013 | Rohrer | H05K 7/1425 | 211/26.2 |
| 2014/0002988 A1* | 1/2014 | Roesner | G06F 1/20 | 361/679.49 |

* cited by examiner

FIELD-RECONFIGURABLE BACKPLANE SYSTEM

CROSS-REFERENCE TO RELATED APPLICATION

The benefit of the filing date of U.S. provisional patent application 61/948,843, filed Mar. 6, 2014, entitled "FIELD-RECONFIGURABLE BACKPLANE SYSTEM," is hereby claimed, and the specification thereof incorporated herein in its entirety by this reference.

BACKGROUND

A card cage is a box-shaped chassis or frame having a number of parallel card slots or bays into which printed circuit cards can be received. A card cage may have metal sidewalls to provide electromagnetic interference (EMI) shielding. Each slot is commonly defined by a pair of card guides: an upper card guide and a lower card guide. When a user inserts a printed circuit card, the upper edge of the printed circuit card engages a slot in the upper card guide while the lower edge of the printed circuit card engages a slot in the lower card guide. The user slides the printed circuit card in the card guides into the card cage until a connector on the rear edge of the printed circuit card mates with a backplane connector on a backplane at the rear of the card cage. A backplane commonly comprises a printed circuit board on which are mounted a number of such backplane connectors, each aligned with one of the card slots or bays. This backplane printed circuit board provides electrical signal interconnections among the backplane connectors.

The printed circuit cards that are inserted in the card cage commonly have faceplates mounted on the front edge of the card. Faceplates of printed circuit cards in adjacent slots abut one another when the spacing between adjacent slots is the minimum that is sufficient to accommodate the width of the faceplates. Printed circuit cards can have faceplates of various widths. It is commonly necessarily to include a group of printed circuit cards having different widths in an electronic system. To mount such a group of printed circuit cards in a card cage, not only must the card cage slots be configured to accommodate the different faceplate widths but the spacing of the backplane connectors on the backplane must be configured accordingly.

SUMMARY

Embodiments of the invention relate to a backplane system having a reconfigurable card guide configuration. In an exemplary embodiment, the backplane system includes a chassis, a plurality of rails, a plurality of card guides, a plurality of backplane connector assemblies, and a plurality of electrical or optical signal cables. The chassis is defined by a width axis, a depth axis and a height axis. The rails are oriented parallel to the width axis, and the card guides are oriented parallel to the depth axis. Each card guide has a slot configured to receive a printed circuit card and extends between a front rail and a rear rail. A front portion of each card guide is engaged with the front rail in a slideable manner. Likewise, the rear portion of each card guide is engaged with the rear rail in a slideable manner. The card guide is thus slideable in the direction of the width axis. Each backplane connector assembly is attached to the rear portion of a card guide and oriented parallel to the height axis. Each backplane connector assembly is configured to mate with a card connector of the printed circuit card received in the card guide slot. Each signal cable can connect two or more of the plurality of backplane connector assemblies with each other to provide signal paths.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
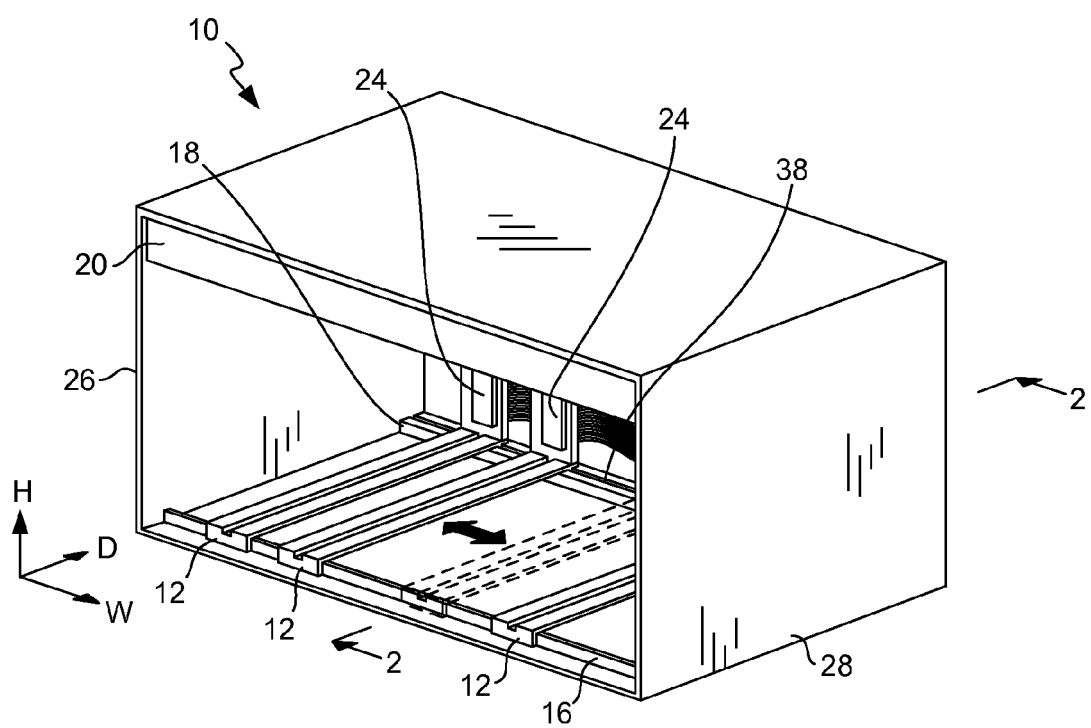
FIG. 1 is a perspective view of a backplane system in accordance with an exemplary embodiment of the invention.
Figure 3:
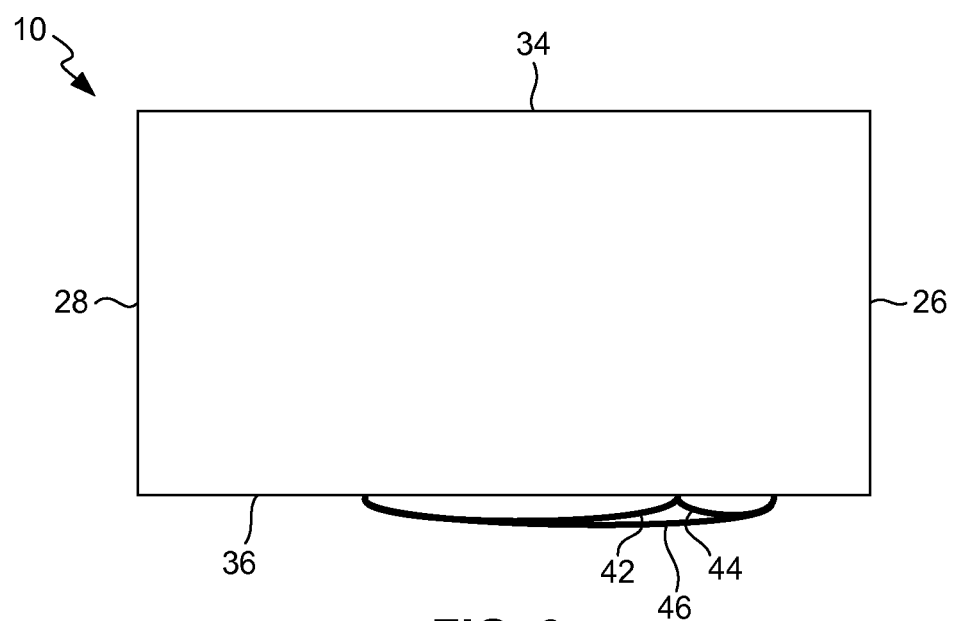
FIG. 3 is a top plan view of the backplane system of FIG. 1.
Figure 4A:
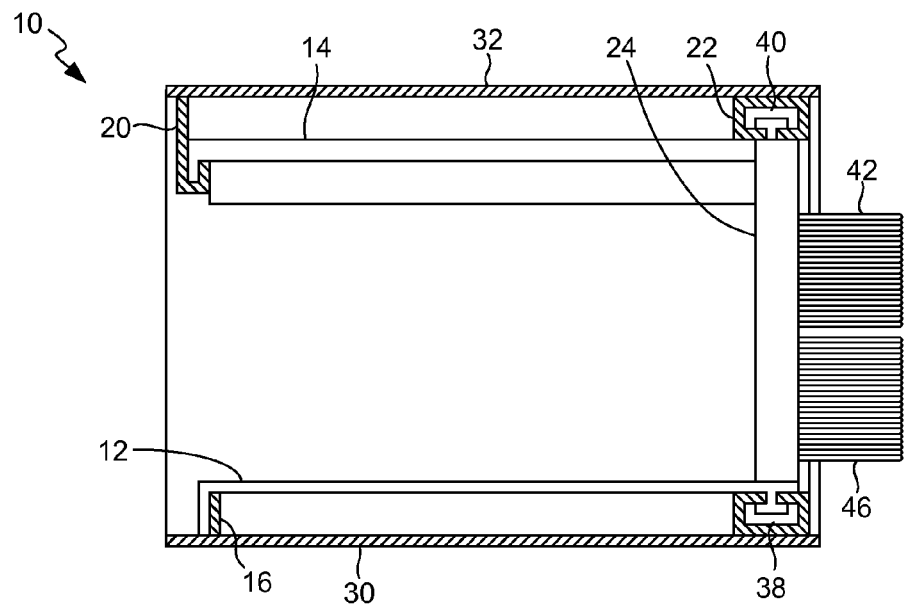
FIG. 4A is a sectional view taken on line 4-4 of FIG. 3.

As illustrated in FIGS. 1 and 4A, in an illustrative or exemplary embodiment of the invention, a backplane system includes a housing or enclosure 10, a plurality of bottom card guides 12, a plurality of top card guides 14 (FIG. 4A), a bottom front rail 16, a bottom rear rail 18, a top front rail 20, a top rear rail 22 (FIG. 4A), and two or more backplane electrical connector assemblies 24. Although in the exemplary embodiment, backplane electrical connector assemblies 24 are provided that carry electrical signals, in other embodiments optical connector assemblies can be provided that carry optical signals. In the exemplary embodiment, enclosure 12 has four metal walls 26, 28, 30 and 32 and open front and rear sides 34 and 36 (FIG. 3), respectively. Nevertheless, in other embodiments (not shown), such a housing or enclosure can have any other suitable shape and structure. In the exemplary embodiment, enclosure 12 is generally box-shaped and has dimensions defined by a width axis ("W"), a depth axis ("D") and a height axis ("H"), which are mutually perpendicular to each other. Each of rails 16-22 is oriented parallel to the width axis. Each of card guides 12 and 14 is oriented parallel to the depth axis. Each of backplane electrical connector assemblies 24 is oriented parallel to the height axis.

In the exemplary embodiment, enclosure 10 and rails 16-22 together define a structural frame or chassis. Although not shown for purposes of clarity, in addition to rails 16-22 the chassis may include additional structural members that interconnect walls 26-32, as well as fasteners for attaching such elements together.

For purposes of clarity, three exemplary backplane electrical connector assemblies 24 are shown. However, the backplane system can include any suitable number of backplane electrical connector assemblies 24. Note that each backplane electrical connector assembly 24 corresponds to, or has associated with it, one of bottom card guides 12 and one of top card guides 14. Each bottom card guide 12 extends between bottom front rail 16 and bottom rear rail 18. Likewise, each top card guide 14 extends between top front rail 20 and top rear rail 22. More specifically, the bottom or lower end of each backplane electrical connector assembly 24 is attached to the rear portion of a corresponding or associated one of bottom card guides 12, while the top or upper end of each backplane electrical connector assembly 24 is attached to the rear portion of a corresponding or associated one of top card guides 14.

The front portion of each bottom card guide 12 engages bottom front rail 16 in a slideable manner. More specifically, the front portion of each bottom card guide 12 is L-shaped and hooks over bottom front rail 16. The L-shaped front portion of each bottom card guide 12 is freely slideable over bottom front rail 16 in the (width-dimension) directions indicated by the double-headed arrow in FIG. 1. Similarly, the rear portion of each bottom card guide 12 engages the bottom rear rail 18 in a slideable manner. More specifically, the rear portion of each bottom card guide 12 is T-shaped and is retained in a slot 38 in bottom rear rail 18. The T-shaped rear portion of each bottom card guide 12 is freely slideable in slot 38 in the (width-dimension) directions indicated by the double-headed arrow in FIG. 1. Accordingly, each bottom card guide 12 is freely slideable in the directions indicated by the double-headed arrow in FIG. 1.

The front portion of each top card guide 14 (FIG. 4A) engages the top front rail 20 in a slideable manner. More specifically, the top front rail 20 is J-shaped, while the front portion of each top card guide 14 is L-shaped and hooks into the J-shaped top front rail 20. The L-shaped front portion of each top card guide 14 is freely slideable in the J-shaped top front rail 20 in the (width-dimension) directions indicated by the double-headed arrow in FIG. 1. Similarly, the rear portion of each top card guide 14 engages the top rear rail 22 in a slideable manner. More specifically, the rear portion of each top card guide 14 is T-shaped and is retained in a slot 40 in top rear rail 22. The T-shaped rear portion of each top card guide 14 is freely slideable in slot 40 in the (width-dimension) directions indicated by the double-headed arrow in FIG. 1. Accordingly, each top card guide 14 is freely slideable in the directions indicated by the double-headed arrow in FIG. 1. It should be understood that the slideable engagements described above are intended only to be exemplary, and in view of the descriptions herein various other slideable engagements will readily occur to one of ordinary skill in the art. For instance, anti-racking features could be incorporated.

As each backplane electrical connector assembly 24 is attached to one associated bottom card guide 12 and one associated top card guide 14, each backplane electrical connector assembly 24 is accordingly moveable in a sliding manner along with its associated top and bottom card guides 12 and 14. That is, a pair of top and bottom card guides 12 and 14 and an associated backplane electrical connector assembly 24 are movable together as a unit in the directions indicated by the double-headed arrow in FIG. 1. Thus, a user (not shown) can move each such pair of top and bottom card guides 12 and 14 and associated backplane electrical connector assembly 24 together as a unit by grasping them and urging them in the desired width-axis direction. Although not shown for purposes of clarity, the above-described slideable engagements have sufficient friction to prevent them from inadvertently moving. That is, the user must apply a sufficient force to overcome the frictional force. Alternatively, in other embodiments (not shown), some or all of rails 16-22 can include detents along their length that can engage card guides 12 and 14. Locking mechanisms could also be incorporated.

Figure 2:
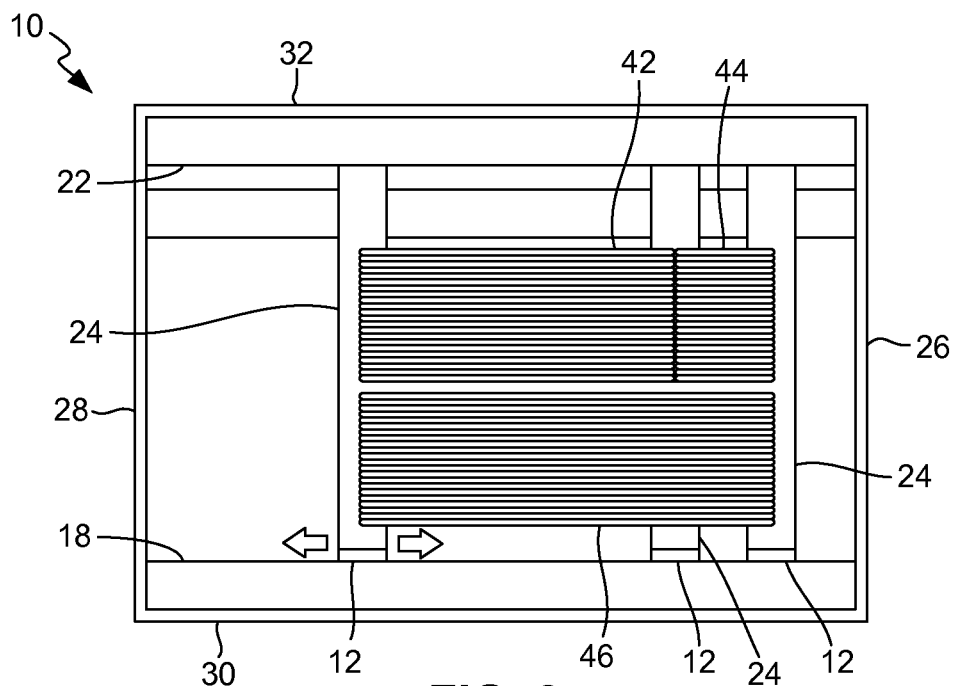
FIG. 2 is a rear elevation view of the backplane system of FIG. 1.

As illustrated in FIGS. 2-3, electrical signal cables 42, 44 and 46 interconnect backplane electrical connector assemblies 24. That is, each of electrical signal cables 42, 44 and 46 connects one of backplane electrical connector assemblies 24 to another of backplane electrical connector assemblies 24. The electrical interconnections shown in FIGS. 2-3 are intended only to be exemplary or illustrative of the various electrical interconnections that can be made. For example, in an embodiment (not shown) having more than the three exemplary backplane electrical connector assemblies 24 shown in FIGS. 1-3, any of them can be connected to any one or more others. It should be noted that electrical signal cables 42, 44 and 46 are depicted in a generalized manner that is not intended to represent a specific type of cable. Rather, electrical signal cables 42, 44 and 46 can comprise any suitable type of cables, such as ribbon cables, coaxial cables, twin-axial cables, flex circuits etc. Although in the exemplary embodiment electrical signal cables 42, 44 and 46 interconnect backplane electrical connector assemblies 24, in other embodiments any other suitable signal communication media, such as optical cables, or a combination of electrical and optical cables, can interconnect corresponding backplane connector assemblies.

Figure 4B:
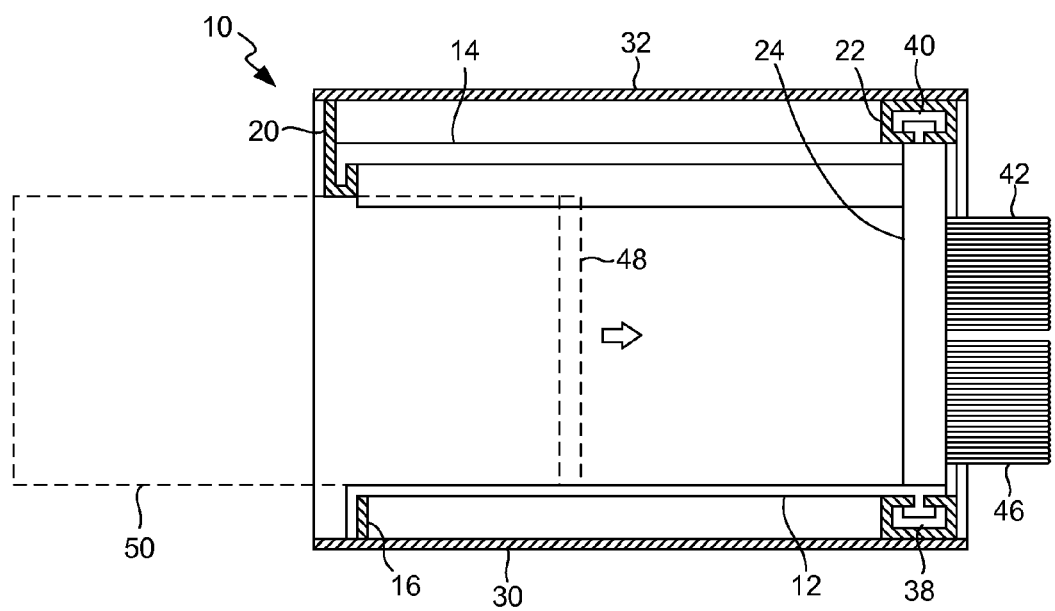
FIG. 4B is similar to FIG. 4A, showing a printed circuit card being received in the card guides.
Figure 4C:
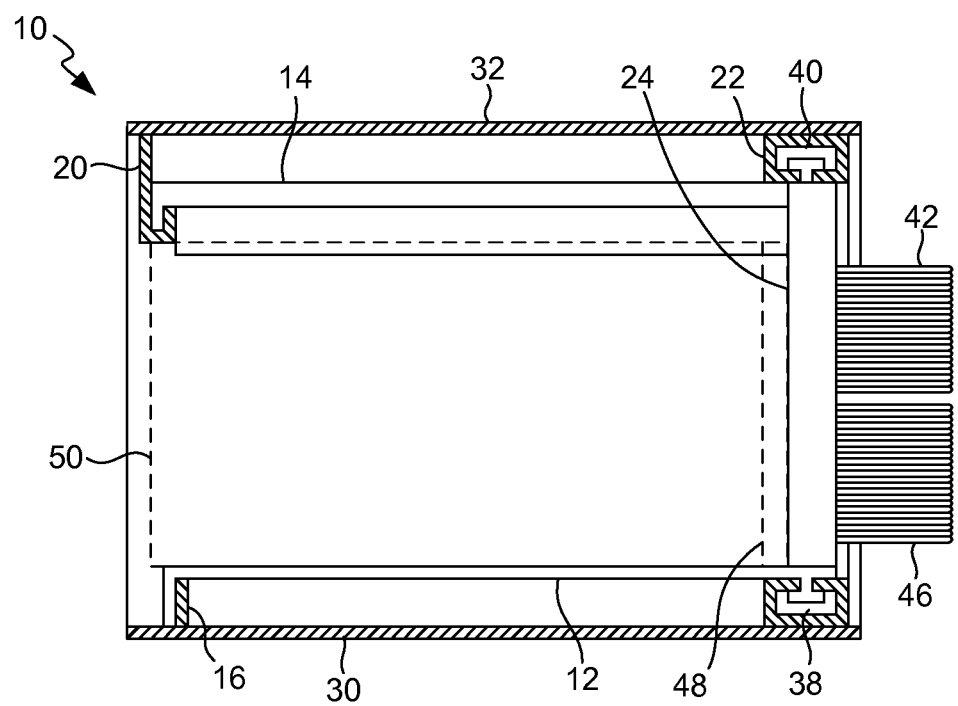
FIG. 4C is similar to FIG. 4B, showing the printed circuit card fully received in the card guides.

With further reference to FIGS. 4B-C, each of backplane electrical connector assemblies 24 comprises a connector structure that is electrically and mechanically mateable with a connector 48 of a printed circuit card 50. Printed circuit card 50 and its card edge connector 48 can be of any suitable type known in the art. Accordingly, the mating connector structure of connector assemblies 24 is not shown in detail. Each bottom card guide 12 and each top card guide 14 is slotted to engage the respective lower and upper edges of printed circuit card 50. As illustrated in FIG. 4B, a user (not shown) can insert printed circuit card 50 into enclosure 10 by engaging the lower edge of printed circuit card 50 in bottom card guide 12 while engaging the upper edge of printed circuit card 50 in the corresponding top card guide 14. The user can then slide printed circuit card 50 further into enclosure 10 until its card edge connector 48 mates with backplane electrical connector assembly 24, as illustrated in FIG. 4C.

A user readily can adjust or reconfigure the spacing between adjacent printed circuit cards 50 by moving card guides 12 and 14 and associated backplane electrical connector assemblies 24 in the sliding manner described above. Electrical signal cables 42, 44 and 46 of lengths suitable for the spacing between adjacent printed circuit cards 50 can be provided either before or after the spacing is configured. For example, a user can adjust the positions of one or more card guides 12 and 14 and associated backplane electrical connector assemblies 24 and then select electrical signal cables 42, 44 and 46 of suitable lengths and plug them into the associated backplane electrical connector assemblies 24. Alternatively, electrical signal cables 42, 44 and 46 can be of lengths sufficiently great to accommodate a wide range of card guide positions. Thus, for example, in an instance in which card guides are moved closer together, the associated cable becomes slackened, and in an instance in which card guides are moved farther apart, the associated cable becomes more taut.

A printed circuit card 50 can be inserted into enclosure 10 in the manner described above either before or after adjusting the positions of the card guides 12 and 14 that receive that printed circuit card 50. Although not shown for purposes of clarity, it is well understood in the art that printed circuit cards 50 of the type that are mountable in card cages can have faceplates (not shown) of various widths. By adjusting or reconfiguring the spacing between adjacent printed circuit cards 50 in this manner, their various faceplate widths can be accommodated. Thus, for example, service personnel at a field site who need to replace a printed circuit card 50 having a certain faceplate width with another printed circuit card 50 having a different (e.g., wider) faceplate width can readily adjust the spacing.

One or more illustrative or exemplary embodiments of the invention have been described above. However, it is to be understood that the invention is defined by the appended claims and is not limited to the specific embodiments described.

What is claimed is:

1. A backplane system, comprising:
a chassis defined by a width axis, a depth axis and a height axis;
a plurality of rails oriented parallel to the width axis;
a plurality of card guides oriented parallel to the depth axis, each card guide having a slot configured to receive a printed circuit card, each card guide extending between a front rail of the plurality of rails and a rear rail of the plurality of rails, each card guide having a front portion slideably engaged with the front rail and slideable in a direction of the width axis and having a rear portion slideably engaged with the rear rail and slideable in the direction of the width axis;
a plurality of backplane connector assemblies, each backplane connector assembly attached to the rear portion of a corresponding one of the plurality of card guides and oriented parallel to the height axis, each backplane connector assembly configured to mate with a card connector of the printed circuit card received in the corresponding one of the plurality of card guides; and
a plurality of signal cables, each signal cable connectable between one of the plurality of backplane connector assemblies and another of the plurality of backplane connector assemblies.

2. The backplane system of claim 1, wherein the chassis comprises a box-shaped housing having at least two metal sidewalls, an open front side, and an open rear side.

3. The backplane system of claim 1, wherein at least one of the rails has a slot, and at least one end portion of a card guide extends into the slot.

4. The backplane system of claim 1, wherein at least one end portion of a card guide hooks over at least one of the rails.

5. A method for using a backplane system, the backplane system comprising a chassis defined by a width axis, a depth axis and a height axis, a plurality of rails oriented parallel to the width axis, a plurality of card guides oriented parallel to the depth axis, a plurality of backplane connector assemblies, and a plurality of signal cables a the method comprising:
inserting a printed circuit card into a slot of one of the plurality of card guides, wherein each card guide has a slot configured to receive one of a plurality of printed circuit card, wherein each card guide extends between a front rail of the plurality of rails and a rear rail of the plurality of rails, each card guide has a front portion slideably engaged with the front rail and slideable in a direction of the width axis and has a rear portion slideably engaged with the rear rail and slideable in the direction of the width axis;
connecting a signal cable between one of a plurality of backplane connector assemblies and another of the plurality of backplane connector assemblies, wherein each backplane connector assembly is attached to the rear portion of a corresponding one of the plurality of card guides and oriented parallel to the height axis, and each backplane connector assembly is configured to mate with a card connector of the printed circuit card received in the corresponding one of the plurality of card guides.

6. The method of claim 5, wherein the chassis comprises a box-shaped housing having at least two metal sidewalls, an open front side, and an open rear side.

7. The method of claim 5, wherein at least one of the rails has a slot, and at least one end portion of a card guide extends into the slot.

8. The method of claim 5, wherein at least one end portion of a card guide hooks over at least one of the rails.

\* \* \* \* \*